(12) United States Patent
Chou (10) Patent No.: US 6,252,218 B1
(45) Date of Patent: Jun. 26, 2001

(54) AMORPHOUS SILICON ACTIVE PIXEL SENSOR WITH RECTANGULAR READOUT LAYER IN A HEXAGONAL GRID LAYOUT

(75) Inventor: Eric Ying-Chin Chou, Fremont, CA (US)

(73) Assignee: Agilent Technologies, Inc, Palo Alto, CA (US)

( * ) Notice: Subject to any disclaimer, the term of this patent is extended or adjusted under 35 U.S.C. 154(b) by 0 days.

(21) Appl. No.: 09/243,186

(22) Filed: Feb. 2, 1999

(51) Int. Cl.$^7$ .............................. H01L 27/00; H04N 3/14
(52) U.S. Cl. ..................... 250/208.1; 257/292; 348/294
(58) Field of Search ........................... 250/208.1, 214 A, 250/214 R, 226, 216; 257/291, 292, 458, 459; 348/294, 300, 241

(56) References Cited

U.S. PATENT DOCUMENTS

| | | | |
|---|---|---|---|
| 4,667,092 | * 5/1987 | Ishihara | 250/216 |
| 5,032,718 | 7/1991 | Murakami | 250/227.2 |
| 5,311,337 | 5/1994 | McCartney, Jr. | 359/61 |
| 5,535,028 | 7/1996 | Bae et al. | 359/61 |
| 5,744,826 | 4/1998 | Takeuchi et al. | 257/77 |
| 5,759,078 | 6/1998 | Levine et al. | 445/24 |
| 5,818,052 | 10/1998 | Elabd | 250/370.09 |

* cited by examiner

*Primary Examiner*—John R. Lee
*Assistant Examiner*—Kevin Pyo (57) ABSTRACT

An active pixel sensor having an amorphous silicon sensing layer and a semiconductor readout layer. A plurality of P-I-N photodiodes are disposed in the sensing layer. The photodiodes define subpixels that are arranged in a hexagonal grid layout. The subpixels can have a hexagonal shape or a circular shape. The sensing layer can include color filters for implementing a color pattern, an infrared filter to absorb infrared radiation, and a microlens for focusing an image on the subpixels. The subpixels can be arranged in a triangular configuration to form a pixel and adjacent pixels can be arranged in the hexagonal grid layout. The readout layer includes a plurality of readout rectangular readout cells that correspond to the subpixels in the sensing layer. The readout cells can be arranged in a triangular configuration to match the subpixels in the sensing layer. The P-I-N photodiodes have an output for generating an output signal that is communicated to the readout cells in the readout layer.

25 Claims, 11 Drawing Sheets

AMORPHOUS SILICON ACTIVE PIXEL SENSOR WITH RECTANGULAR READOUT LAYER IN A HEXAGONAL GRID LAYOUT

BACKGROUND OF THE INVENTION

The present invention relates generally to an active image sensor and particularly to an active image sensor with an amorphous silicon sensing layer and a semiconductor readout layer.

Many modern imaging systems such as digital cameras, camcorders, scanners, copiers, and the like require an image sensor capable of capturing an image with high resolution and color fidelity. A majority of the imaging systems use a solid-state image sensor due to constraints on system size, weight, power consumption, heat dissipation, and durability. The ability of the imaging system to capture images with high resolution and color fidelity depends to a large extent on the image sensor used. Image sensor resolution is typically measured in number of pixels contained in the image sensor. The resolution of a solid-state sensor can be increased by shrinking the size of the pixels so that more pixels fit within a predetermined area. An image incident on an image sensor having more pixels per unit of area can be captured with greater resolution than an image sensor having fewer pixels per unit of area. Pixel geometry and symmetry between pixels can also affect the number of pixels per unit of area. Additionally, the symmetry between pixels can affect color aliasing. Other factors, such as electrical noise generated by the pixels can affect image quality. Additionally, for color images, the color fidelity of the image can be affected by a predetermined color pattern assigned to the pixels in the image sensor.

Desirable attributes of an image sensor include low electrical noise, flexibility in color pattern, optimized pixel density and geometry for increased resolution, symmetry between adjacent pixels, and maximized pixel fill-factor. Low electrical noise prevents an image signal generated by the pixel from being corrupted by noise; furthermore, noise and leakage current from an individual pixel can affect the image signal from adjacent pixels. Additionally, pixel electrical noise can be affected by pixel geometry and symmetry between pixels. Circuitry or algorithms to filter out the electrical noise can be minimized or eliminated by reducing the noise generated by each pixel. A flexible color pattern allows the image sensor to be tailored to specific applications such as a RGB color pattern for photography or video, or a CMY color pattern for printing or scanning, for example.

Pixels having a rectangular geometry can generate additional noise due to abrupt rectangle edges which create leakage current in an active device such as a photodiode, for example. A pixel geometry that eliminates noise due to abrupt edges is desirable. Further, it is desirable to maximize the active area of the pixel devoted to capturing the image so that the ratio of the active area to the pixel area approaches a fill-factor of 100%. By removing components, such as transistors and signal routing lines, from the pixel, the area that was occupied by the components can be used to maximize the active area of the pixel thereby increasing the fill-factor.

Previous image sensor designs include photo-gate active pixel sensors, bulk silicon photodiode pixel sensors with three transistors, pulsed bipolar CMOS active pixel sensors, and rectangular CMOS pixel sensors.

The photo-gate active pixel sensor utilizes four transistors inside of a CMOS photo-gate pixel for low noise operation and for electronic shuttering. However, this number of transistors results in a pixel area that is not competitive with state-of-the-art CCD image sensors that have pixel areas approaching 5×5 $\mu m^2$. The number of transistors in the photo-gate sensor results in a lower fill-factor when compared to the state-of-the-art CCD image sensor.

The pulsed bipolar CMOS active pixel sensor employs a vertical bipolar device in a CMOS process. The use of bipolar devices results in a smaller pixel area due to fewer transistors in the pixel; however, disadvantages of this design include image lag and the need to amplify an output signal from the pixel with a high $\beta$ gain bipolar transistor. The high $\beta$ gain bipolar transistor exhibits signal degradation under low current conditions and limits scalability of the pixel due to an integrating amplification stage in a readout path of the pixel. Further, an extra emitter terminal is required to prevent an overflow condition. The extra emitter terminal creates an unsymmetrical pixel layout in the CMOS process. In the pulsed bipolar CMOS active pixel sensor, pixel area is not minimized because CMOS design rules require adjacent pixels to be spaced apart to comply with design rules for N-well spacing.

The bulk silicon photodiode pixel sensor is not competitive with the state-of-the-art CCD image sensor because the photodiode and the transistors are integral to the same silicon layer and the area occupied by the transistors reduces the active area available for the photodiode resulting in a fill-factor of about 30% using 1.2 $\mu m$ CMOS process technology.

Rectangular CMOS active pixel sensor designs utilize a rectangular pixel geometry with the pixels laid out in a rectangular grid. It is clearly understood that the rectangular grid does not result in an optimized pixel density. Bayer's color pattern was developed as the color filter array (CFA) pattern for the rectangular grid. In the Bayer CFA pattern, color density for Red, Green, and Blue sensors is in the ratio of 1:2:1. Therefore, there are two Green pixels for each Red pixel and Blue pixel in the array. In general, the color density for the Bayer CFA pattern is not the best choice because it undersamples two of the sensor colors (Red and Blue) and the color pattern kernel is not symmetric. In the Bayer CFA pattern, linear horizontal, linear vertical, and linear diagonal image features never pass through more than two different color sensor locations because the Red and the Blue sensor locations are never adjacent to sensors of the same color. The rectangular pixel geometry is not amenable to flexible color patterning.

Figure 1:
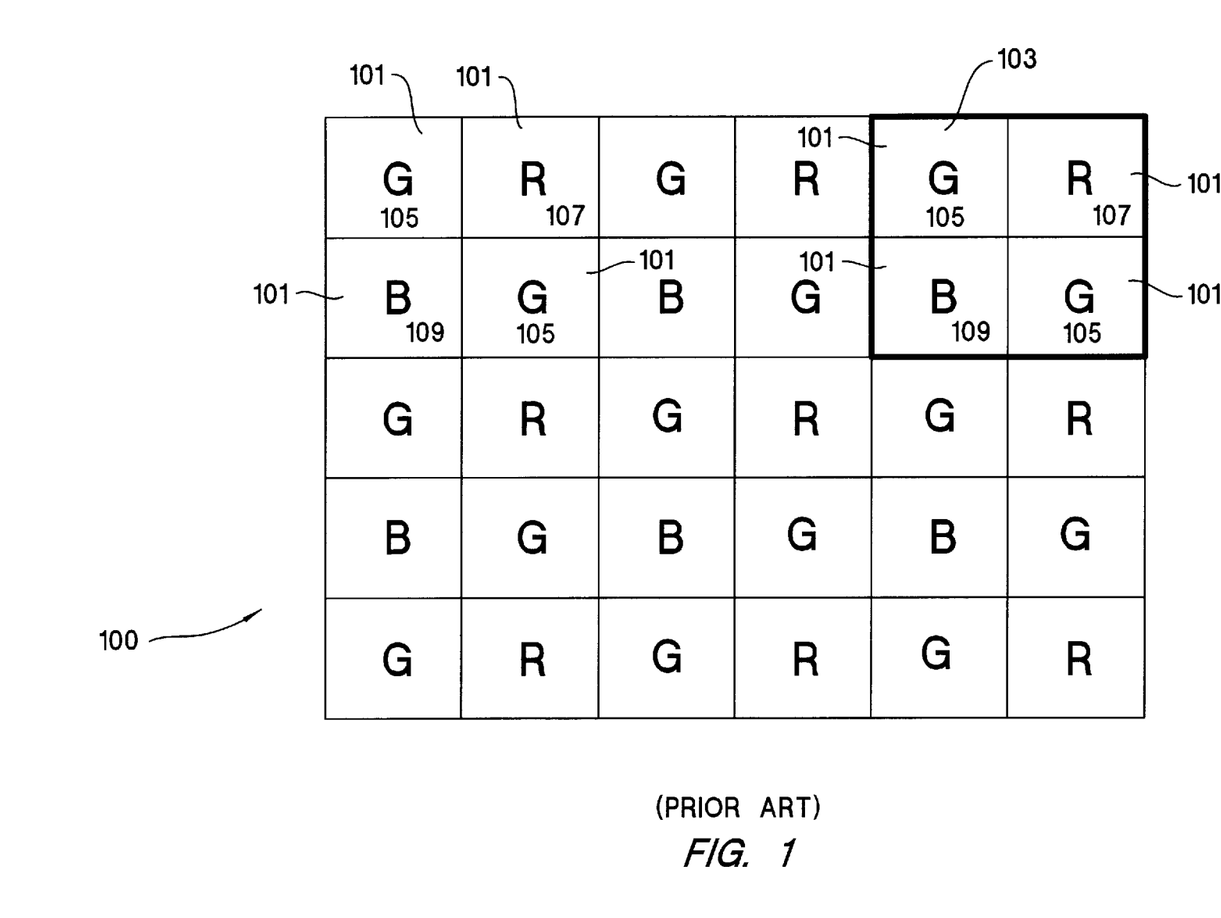
FIG. 1 is a top plan view of a Prior Art rectangular CMOS active pixel sensor with a Bayer CFA pattern.

In FIG. 1, there is provided for purposes of illustration a prior art rectangular CMOS active pixel sensor designated generally as 100. The sensor 100 has a plurality of subpixels 101. Four of the subpixels 101 define a pixel 103, shown in heavy outline. The pixel 103 has two Green subpixels 105, one Red subpixel 107, and one Blue subpixel 109. This arrangement of the color pattern for the subpixels 101 in the pixel 103 corresponds to the Bayer CFA pattern wherein the color density of the Red subpixel 107, the Green subpixels 105, and the Blue subpixel 109 is in the ratio of 1:2:1, wherein the pixel 103 has two Green subpixels 105 for one Red subpixel 107 and one Blue subpixel 109.

Figure 2:
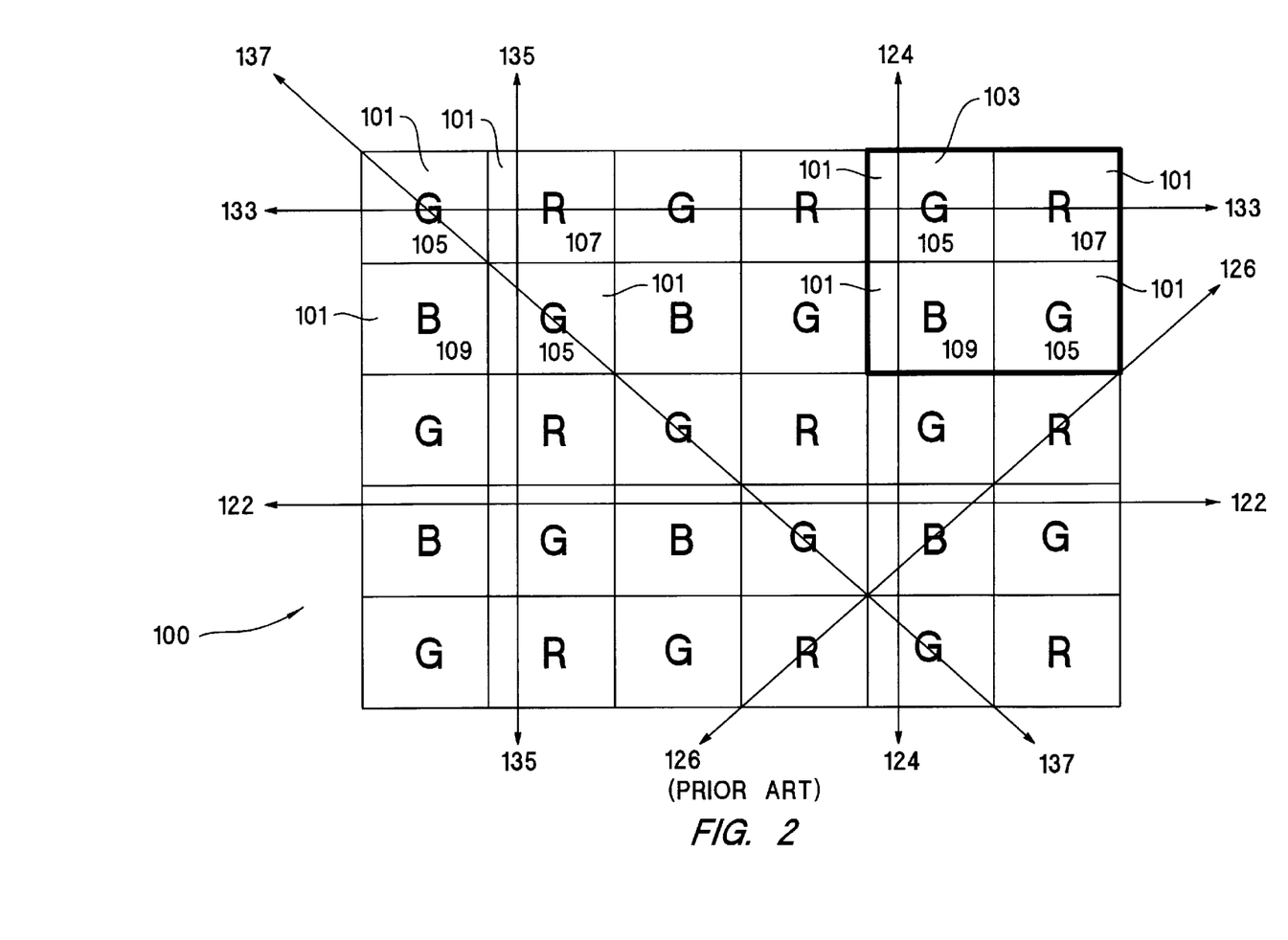
FIG. 2 is a top plan view of a Prior Art rectangular CMOS active pixel sensor illustrating lineal image traversals.

FIG. 2 illustrates lineal image feature traversals across prior art sensor 100. In a first horizontal traverse as shown by an arrow 133, the image feature traverses the Green subpixels 105 and the Red subpixels 107. In a second horizontal traverse as shown by an arrow 122, the image feature traverses the Blue subpixels 109 and the Green subpixels 105. The first horizontal traverse 133 never crosses the Blue subpixels 109. Similarly, the second horizontal traverse 122 never crosses the Red subpixels 107. Because the Bayer CFA color pattern kernel is not symmetric the first horizontal traverse 133 and the second horizontal traverse 122 never make a sequential crossing of the Red subpixels 107, the Green subpixels 105, and the Blue subpixels 109 in a single traverse of the sensor 100. The same is true for a first vertical traverse as shown by an arrow 135 where only the Green subpixels 105 and the Red subpixels 107 are traversed. In a second vertical traverse as shown by an arrow 124, only the Green subpixels 105 and the Blue subpixels 109 are traversed. Additionally, in a first diagonal traverse as shown by an arrow 137, only all the Green subpixels 105 are traversed. In a second diagonal traverse as shown by an arrow 126 only the Red subpixels 107 and the Blue subpixels 109 are traversed. Because the Bayer CFA pattern lacks color symmetry between adjacent subpixels 101 a sequential traverse of the Red subpixels 107, the Green subpixels 105, and the Blue subpixels 109 consistent with the RGB color pattern is not possible for vertical, horizontal, and diagonal image features. CMOS photo-gate and photodiode implementations of an active pixel sensor exhibit crosstalk between pixels of different color due to electron leakage from an electron collection node. Additionally, crosstalk is exacerbated by any non-uniformity in distance between pixels. Such non-uniformity can result in a non-uniform crosstalk pattern especially for different color channels. Due to the rectangular geometry and the Bayer CFA pattern, a pixel is surrounded by a group of eight pixels. The pixels in the group that are horizontally or vertically adjacent to the surrounded pixel are closer to the surrounded pixel than pixels that are diagonally adjacent to the surrounded pixel resulting in a variation in distance between the surrounded pixel and the other pixels in the group. A non-uniform crosstalk pattern is created by the variation in distance.

Figure 3:
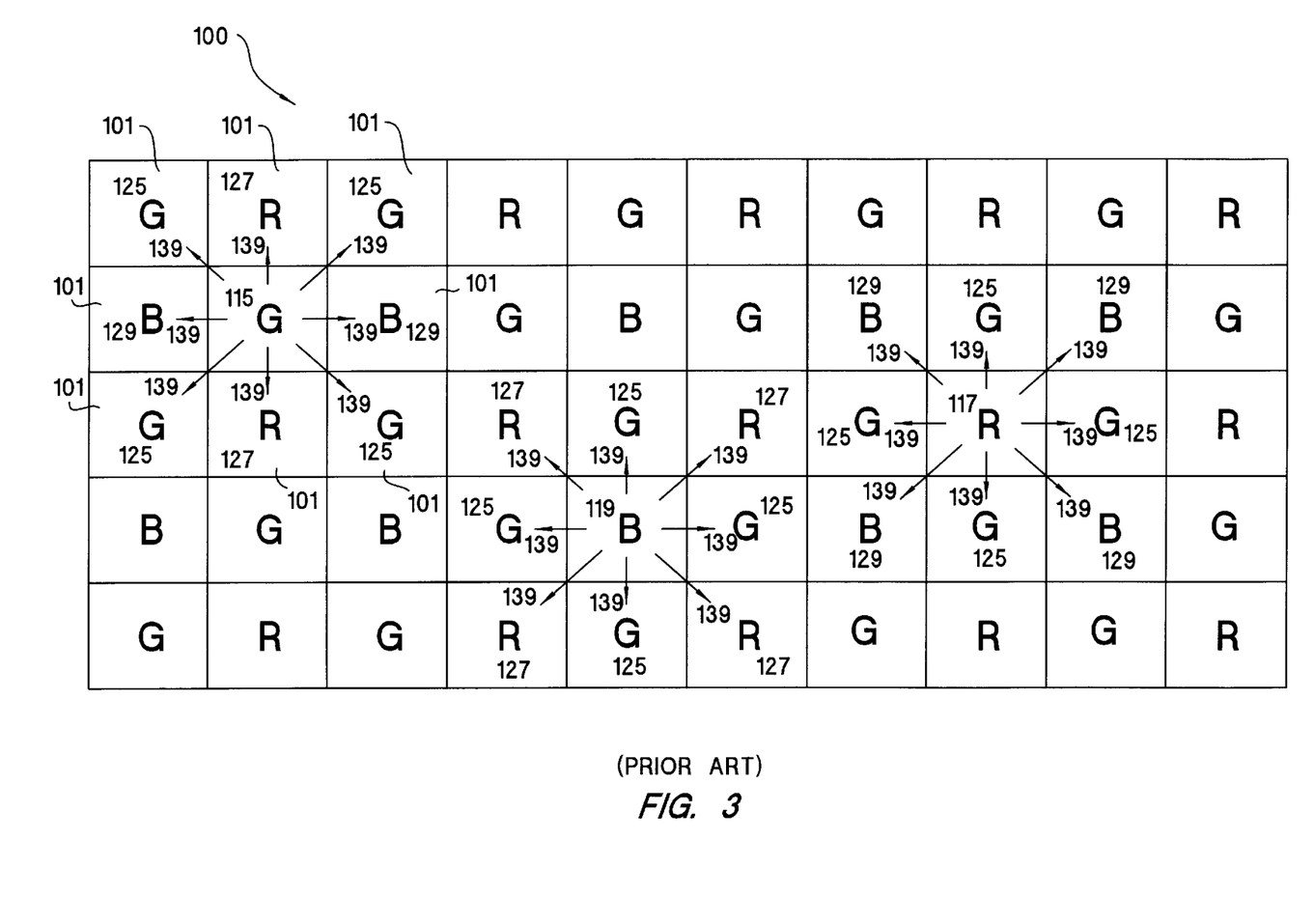
FIG. 3 is a top plan view of a Prior Art rectangular CMOS active pixel sensor illustrating relative distance between adjacent subpixels.

In FIG. 3, for purposes of illustration, the relative distance between adjacent subpixels 101 of prior art sensor 100 is shown by arrows 139. Red subpixel 117 is surrounded by four Green subpixels 125 and four Blue subpixels 129. The Blue subpixels 129 are diagonally adjacent to the Red subpixel 117 and are at a greater distance from the Red subpixel 117 than the Green subpixels 125 that are abutted to the Red subpixel 117. Similarly, Blue subpixel 119 is surrounded by four Green subpixels 125 and four Red subpixels 127 with the Red subpixels 127 positioned diagonal to and at a greater distance from the Blue subpixel 119 than the Green subpixels 125. The Green subpixels 125 are abutted to the Blue subpixel 119 and are therefore closer in distance to the Blue subpixel 119 than the Red subpixels 127. Green subpixel 115 is surrounded by two Red subpixels 127, two Blue subpixels 129, and four Green subpixels 125. The two Red subpixels 127 and the two Blue subpixels 129 are abutted to the Green subpixel 115, whereas the four Green subpixels 125 are positioned diagonal to the Green subpixel 115. Because of the oversampling of Green by a factor of two to one over Red and Blue in the Bayer CFA pattern, the Green subpixel 115 is surrounded by four Green subpixels 125. For each instance of a surrounded subpixel the extra distance between the surrounded pixel and diagonally adjacent pixels can result in a non-uniform cross talk pattern. For the Green subpixel 115, the non-uniform cross talk pattern can be exacerbated because the Green subpixel 115 is not surrounded by an equal number of subpixels having the same color. The two Blue subpixels 129 and the two Red subpixels 127 may not have cross talk patterns that cancel, resulting in additional cross talk due to color imbalance that is additive with the cross talk due to the extra distance of the four Green subpixels 125 that are diagonal to the Green subpixel 115.

From the foregoing it will be apparent that there is a need for a high resolution, low noise, flexible color pattern, high fill-factor, optimized pixel geometry, high density, and low crosstalk active image sensor.

SUMMARY OF THE INVENTION

In a preferred embodiment the invention provides an active image sensor in which photodiodes are laid out in a geometrically-efficient pattern, preferably hexagonal as opposed to rectilinear, and in which the photodiodes and their associated amplifiers are stacked vertically. Such an image sensor has a higher pixel density than the other sensors and offers higher resolution, better color fidelity, less noise, less crosstalk, and a more flexible CFA pattern.

In one embodiment, the image sensor includes a semiconductor substrate having a plurality of readout cells formed in the substrate. The substrate defines a readout layer with the readout cells positioned in rows. Each readout cell has a signal input. A dielectric material is formed on the readout layer to define a sensing layer. A plurality of cavities are formed in the sensing layer. The cavities are arranged in a hexagonal grid layout and are positioned in opposing relation to the readout cells in the readout layer. An intrinsic amorphous silicon P-I-N photodiode is formed in each cavity of the sensing layer. Each photodiode generates an output signal indicative of light incident on the photodiode. An interconnect communicates the output signal from the photodiode to the signal input of the readout cell. A biased optically transparent electrode is disposed in each cavity and operates to bias the photodiode and allows light incident on the electrode to be imaged onto the photodiode. The photodiode and the electrode define a subpixel of the sensing layer.

An opaque optical shield may be used to prevent light incident on the photodiode from impinging on the readout layer.

The subpixel is preferably shaped so as to optimize subpixel density in the sensing layer. A hexagonal shape works well, but another suitable shape such as a circular shape may be used.

An amplifier is preferably disposed in each readout cell vertically stacked beneath an associated photodiode and in electrical communication therewith to amplify the signal from that photodiode. Placing the amplifier beneath its associated photodiode eliminates signal routing lines, transistors, and other components from the active area of the photodiode thereby maximizing the area of the photodiode available for receiving incident light.

In one embodiment, the readout layer has a serpentine bus and a stair-step bus. The serpentine bus and the stair-step bus are defined by a row having a first pattern of signal routing and an adjacent row having a second pattern of signal routing. The first and second patterns align to form the serpentine bus and the stair-step bus. The serpentine bus and the stair-step bus are extended throughout the readout layer. As mentioned above, the active area of the photodiode in the sensing layer is maximized by placing the signal routing in the readout layer.

The sensing layer may include a filter layer positioned adjacent to the electrode. In one embodiment the filter layer is a color filter. The color filter may be varied among the subpixels to produce a desired color pattern or to create symmetry or asymmetry in the color filter pattern among adjacent subpixels.

The sensing layer may include an infrared filter to attenuate the absorption of infrared noise from the light incident on the subpixel.

In another embodiment, the sensing layer includes a microlens positioned adjacent the subpixel for focusing incident light onto the subpixel.

Other aspects and advantages of the present invention will become apparent from the following detailed description, taken in conjunction with the accompanying drawings, illustrating by way of example the principles of the present invention.

DETAILED DESCRIPTION

In the following detailed description and in the several figures of the drawings, like elements are identified with like reference numbers.

As shown in the drawings for purposes of illustration, the invention is embodied in an image sensor including a semiconductor substrate defining a readout layer and a dielectric material defining a sensing layer. The readout layer has a plurality of readout cells formed in the substrate an arranged in rows. The readout cells in a row are offset in position with respect to the readout cells in an adjacent row. Each readout cell has a signal input. The dielectric material is formed on the readout layer to define the sensing layer. A plurality of cavities are formed in the sensing layer. The cavities are arranged in a hexagonal grid layout and are positioned in opposing relation to the readout cells in the readout layer. A portion of each cavity has an opening in communication with the signal input of the readout cell. An intrinsic amorphous silicon P-I-N photodiode is formed in each cavity and defines a subpixel of the image sensor. Each photodiode generates an output signal indicative of light incident thereon. An interconnect positioned in the opening of each cavity communicates the output signal from the photodiode to the signal input of the readout cell. A biased optically transparent electrode is disposed in the cavity and operates to bias the photodiode and allows light incident on the electrode to be imaged onto the photodiode. The photodiode and the electrode define a subpixel. The image sensor of the present invention has an optimal subpixel density, maximizes subpixel fill-factor, has a flexible subpixel geometry, can be implemented with a variety of color patterns, reduces electrical noise and crosstalk, and provides for uniform spacing and symmetry between subpixels.

Figure 4:
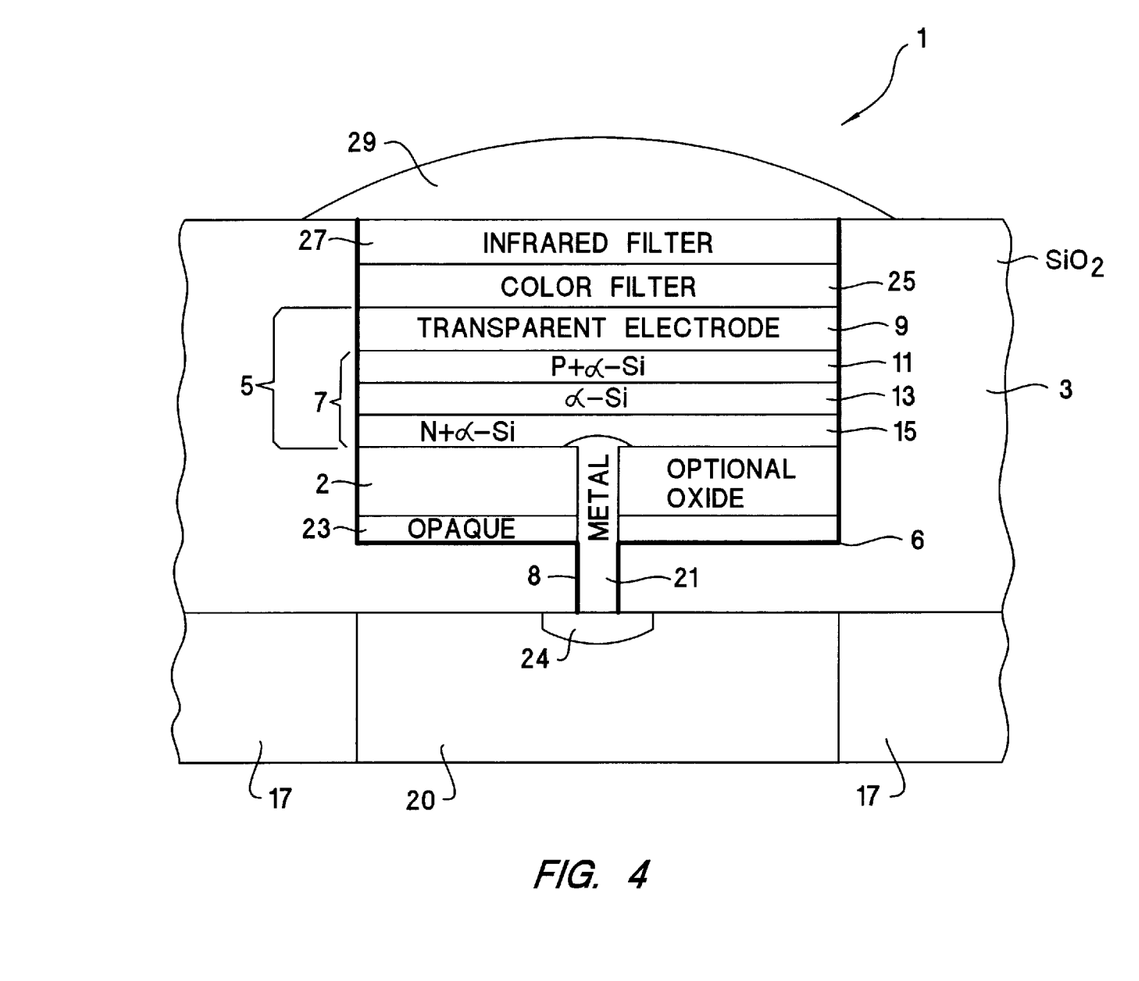
FIG. 4 is a cross-sectional view of an image sensor with a sensing layer and a rectangular readout layer according to the present invention.

Referring to FIG. 4, there is provided in accordance with the present invention an image sensor generally designated as 1. The image sensor 1 includes a semiconductor substrate that defines a readout layer 17. The readout layer 17 has a plurality of readout cells 20 formed therein. FIG. 4 illustrates one readout cell 20 in the readout layer 17. The readout cells 20 are arranged in rows with the readout cells 20 in a row offset in position with respect to the readout cells 20 in an adjacent row. The readout layer 17 can be any semiconductor substrate, for example, bulk silicon.

A dielectric material is formed on the readout layer 17 to define a sensing layer 3. A plurality of cavities 6 are formed in the sensing layer 3. The cavities 6 are arranged in a hexagonal grid layout and are positioned in opposing relation to the readout cells 20 so that there is a one-to-one correspondence between each cavity 6 in the sensing layer 3 and each readout cell 20 in the readout layer 17. The dielectric material can be any insulator such as silicon dioxide or silicon nitride, for example.

An intrinsic amorphous silicon P-I-N photodiode 7 is formed in the cavity 6. The photodiode 7 is operative to generate an output signal indicative of light incident on the photodiode 7. The photodiode 7 can be formed by depositing a layer of N-type amorphous silicon 15 in the cavity 6 followed by a layer of intrinsic amorphous silicon 13, and finally a layer of P-type amorphous silicon 11, for example. A portion of the cavity 6 has an opening 8 in communication with a signal input 24 of the readout cell 20. An interconnect 21 disposed in the opening 8 communicates the output signal of the photodiode 7 to the signal input 24. The interconnect 21 can be made from a conductor such as aluminum or tungsten, for example.

A biased optically transparent electrode 9 is disposed on the photodiode 7 to bias the photodiode 7 and to allow light incident on the electrode 9 to be imaged onto the photodiode 7. The electrode 9 is in electrical communication with a voltage source such as ground and with the layer 11. The electrode 9 can be implemented using indium tin oxide (ITO), for example. The electrode 9 and the photodiode 7 define a subpixel 5 of the image sensor 1. FIG. 4 illustrates one subpixel 5 in the sensing layer 3.

In an embodiment of the present invention, the sensing layer 3 may include a filter layer 25 operative to pass a selected wavelength of light from the light incident on the subpixel 5. The filter layer 25 is shown adjacent to the electrode 9; however, the filter layer 25 can be positioned anywhere in the sensing layer 3 provided that the incident light is filtered before reaching the subpixel 5.

In one embodiment, the filter layer 25 is a color filter. The color filter has a predetermined color. The wavelength of light passed by the color filter can be a color such as Red, Green, Blue, Cyan, Magenta, or Yellow, for example. Any color suitable for the desired application of the image sensor 1 may be used for the color of the color filter. In some applications, particularly those involving digital photography or video, the color of the color filter can be a color from a RGB color pattern consisting of Red, Green, and Blue, for example. For printing or scanning applications the color of the color filter can be a color from a CMY color pattern consisting of Cyan, Magenta, and Yellow, for example.

Additionally, the sensing layer 3 may include an infrared filter 27 positioned adjacent the electrode 9. The infrared filter 27 is operative to attenuate infrared noise from the light incident on the subpixel 5. A separate infrared filter 27 may be positioned adjacent to each of the subpixel 5 as shown in FIG. 4 or the infrared filter 27 may be a single layer that covers all of the subpixels 5 in the sensing layer 3.

In another embodiment of the present invention, the sensing layer 3 includes a microlens 29 positioned to focus incident light onto the subpixel 5. The microlens 29 can be implemented using state-of-the-art semiconductor microlens fabrication techniques.

In one embodiment of the present invention, the subpixel 5 includes an opaque optical shield layer 23. The shield layer 23 is operative to prevent light incident on the subpixel 5 from passing through the sensing layer 3 and impinging on the readout layer 17. A second dielectric material 2 may be deposited above the shield layer 23 to electrically isolate the shield layer 23 from the layer 15. In another embodiment the opaque optical shield layer 23 is disposed in the sensing layer 3 intermediate between the subpixel 5 and the readout layer 17.

Figure 5A:
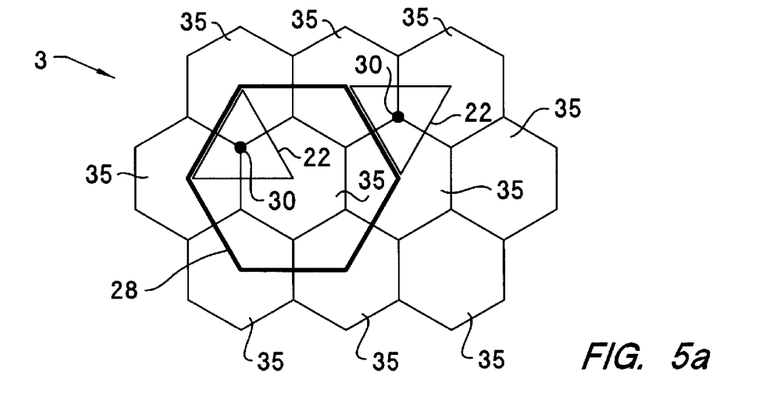
FIG. 5a is a top plan view of an image sensor with hexagonally shaped subpixels according to the present invention.
Figure 6:
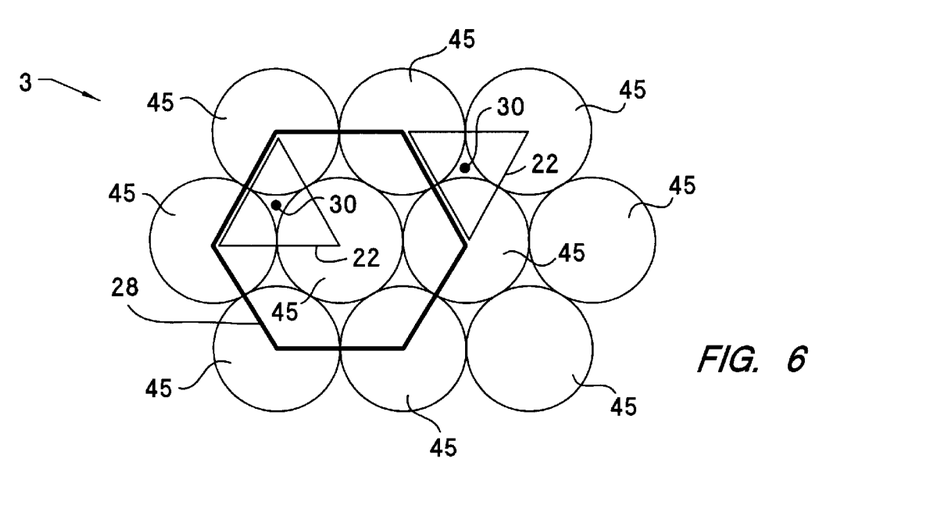
FIG. 6 is a top plan view of an image sensor with circularly shaped subpixels according to the present invention.

Referring to FIG. 5a, the sensing layer 3 has subpixels 35 arranged in a hexagonal grid layout 28, shown in heavy outline. The hexagonal grid layout 28 results in each of the subpixels 35 in the sensing layer 3 being surrounded by six adjacent subpixels 35. The hexagonal grid layout 28 is replicated throughout the sensing layer 3. All seven adjacent subpixels 35 in the hexagonal grid layout 28 are positioned in symmetrical relation to one another. Electrical noise due to differences in distance between adjacent subpixels is minimized by arranging the subpixels 35 in the hexagonal grid layout 28. In one embodiment of the present invention, the subpixels 35 have a substantially hexagonal shape. Preferably, the shape of the subpixels 35 can be an equilateral hexagon. Similarly, in another embodiment of the present invention, as illustrated in FIG. 6, the sensing layer 3 has subpixels 45 having a substantially circular shape and arranged in the hexagonal grid layout 28.

In another embodiment of the present invention, the sensing layer 3 has a pixel 30 defined by three of the subpixels 35. In one embodiment of the present invention, the subpixels 35 in the pixel 30 are arranged in a triangular configuration 22 as shown in FIG. 5a. The triangular configuration 22 when used in conjunction with the hexagonal shape for the subpixels 35 provides for a high density image sensor with symmetry between the subpixels 35 in the pixel 30 and between adjacent pixels 30 in the sensing layer 3. The arrangement of the subpixels 35 used to define the pixel 30 is not limited to the triangular configuration 22 and other configurations are possible, such as the subpixels 35 arranged along a line to define the pixels 30, for example. Similarly, in another embodiment of the present invention, as illustrated in FIG. 6, the pixel 30 may be defined by three of the subpixels 45. Additionally, the subpixels 45 in the pixel 30 can be arranged in the triangular configuration 22.

Subpixels can be formed by using photolithography and etching methods common to the semiconductor processing art to create the desired shape for the cavity 6 in the dielectric material of the sensing layer 3.

Figure 5B:
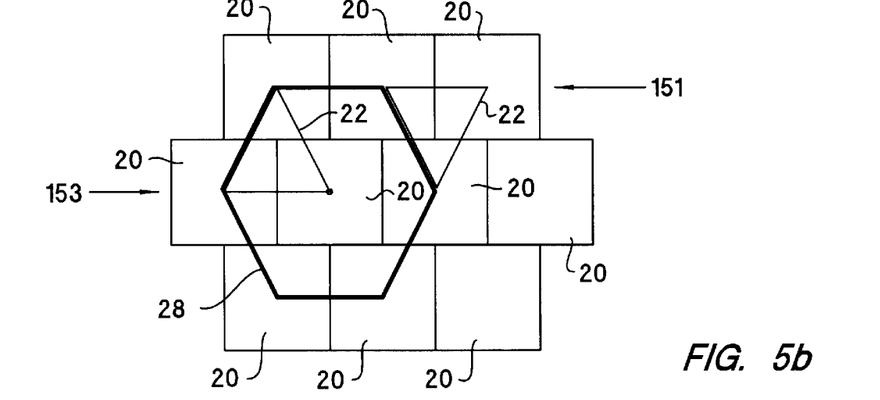
FIG. 5b is a top plan view of an image sensor with readout cells in a hexagonal grid layout according to the present invention.

In one embodiment of the present invention, as illustrated in FIG. 5b, the readout cells 20 in row 151 of the readout layer 17 are offset in position with respect to the readout cells 20 in an adjacent row 153 of the readout layer 17 so that the readout cells 20 in the readout layer 17 are also arranged in the hexagonal grid layout 28, shown in heavy outline. The hexagonal grid layout 28 is replicated throughout the readout layer 17.

In another embodiment the readout cells 20 in the readout layer 17 are arranged in the triangular configuration 22 by offsetting the readout cells 20 in the row 151 by a distance of one-half the width of a readout cell 20 with respect the to readout cells 20 in the adjacent row 153. The corresponding symmetry in placement between the readout cells 20 in the readout layer 17 and the subpixels 35 in the sensing layer 3, as illustrated in FIG. 5a, allows for flexibility in the relative placement of the subpixels 35 with respect to their matching readout cells 20. For example, the subpixels 35 can be positioned directly above their matching readout cells 20, or the subpixels 35 can be positioned above their matching readout cells 20 but displaced in a horizontal direction. If the subpixels 35 are displaced, the opening 8 for the interconnect 21 should be positioned to align with the signal input 24 of its matching readout cells 20. However, alignment is not necessary if intermediate levels of interconnect are used to communicate the output signal from the subpixels 35 to the signal input 24 of the readout cells 20.

Figure 7A:
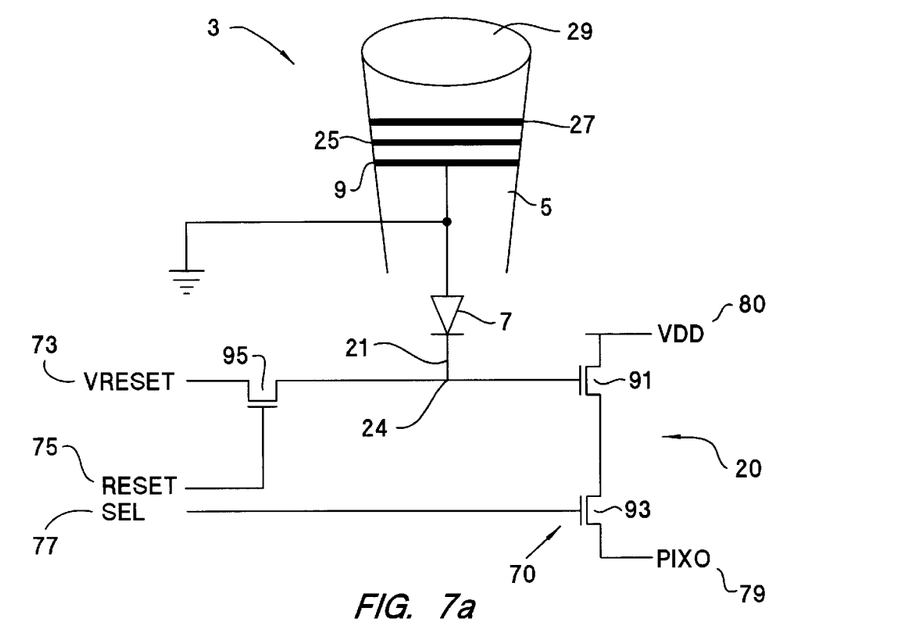
FIG. 7a is a schematic of an amplifier in a readout cell according to the present invention.

In one embodiment of the present invention, as illustrated in FIG. 7a, the readout cell 20 include an amplifier generally designated as 70. The output signal from the P-I-N photodiode 7 is communicated to the signal input 24 of the readout cell 20 by the interconnect 21. The amplifier 70 is in electrical communication with the signal input 24 and is operative to amplify the output signal. The amplifier 70 has an amp output 79 indicative of the amplified output signal.

The amplifier 70 may include a transistor 93 with a source terminal that provides the amp output 79, a gate terminal connected to a select input 77, and a drain terminal connected to a source terminal of a transistor 91. The transistor 91 has a drain terminal connected to a voltage source, such as VDD, for example, and a gate terminal connected to the signal input 24. A transistor 95 has a source terminal connected to the signal input 24, a drain terminal connected to a reset voltage input 73, and a gate terminal connected to a reset input 75. The transistor 91 amplifies the signal present at the signal input 24. The transistor 93 receives the amplified signal from the source terminal of the transistor 91 and transfers the amplified signal to the amp output 79 when the transistor 93 is switched on. A voltage present at the reset voltage input 73 is communicated to the gate terminal of transistor 91 when the transistor 95 is switched on by a signal on the reset input 75 and transferred to the amp output 79 when the transistor 93 is switched on.

Figure 7B:
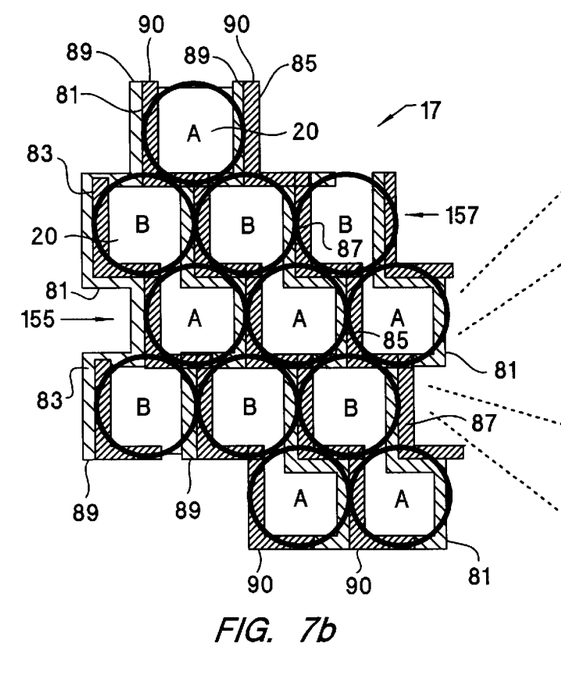
FIGS. 7b, 7c, and 7d are top plan views of readout cell signal routing according to the present invention.

In an embodiment of the present invention, as illustrated in FIG. 7b, the readout layer 17 includes a serpentine bus 89 and a stair-step bus 90. The serpentine bus 89 and the stair-step bus 90 are formed on the readout layer 17 and intersect the rows of the readout layer 17. The serpentine bus 89 and the stair-step bus 90 can be made from metals such as aluminum and tungsten, for example. The serpentine bus 89 and the stair-step bus 90 are operative to route signals between the readout cells 20 and the readout layer 17.

Figure 7C:
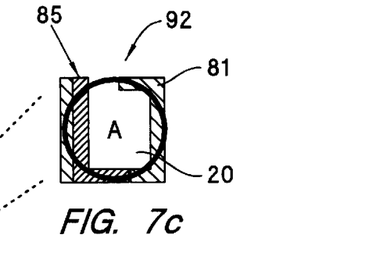
Figure 7D:
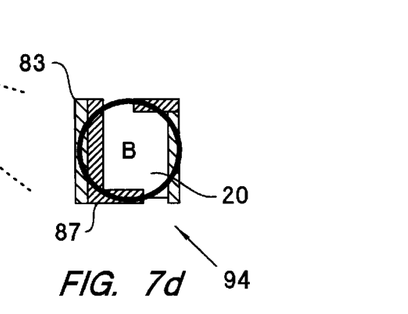

In one embodiment of the present invention, a row 155 in the readout layer 17 has readout cells 20 with an A-type interconnect pattern 92 formed therein and an adjacent row 157 in the readout layer 17 has readout cells 20 with a B-type interconnect pattern 94 formed therein. The readout cells 20 having the A-Type interconnect pattern 92, include a C-shaped interconnect 81 and a first L-shaped interconnect 85. The readout cells 20 having the B-type interconnect pattern 94 include a second L-shaped interconnect 83 and a third L-shaped interconnect 87. The C-shaped interconnect 81 is in electrical communication with the second L-shaped interconnect 83 and defines the serpentine bus 89. The first L-shaped interconnect 85 is in electrical communication with the third L-shaped interconnect 87 defining the stair-step bus 90. The serpentine bus 89 and the stair-step bus 90 intersect the row 155 and the adjacent row 157 of the readout layer 17.

The offset position of the readout cells 20 in the row 155 with respect to the readout cells 20 in the adjacent row 157, coupled with the A-Type interconnect pattern 92 and the B-Type interconnect pattern 94 form an efficient and unique routing structure for communicating signals between the readout cells 20 and the readout plane 17.

In another embodiment of the present invention, the serpentine bus 89 is in electrical communication with the amp output 79 and the stair-step bus 90 is in electrical communication with the reset voltage input 73.

Figure 8:
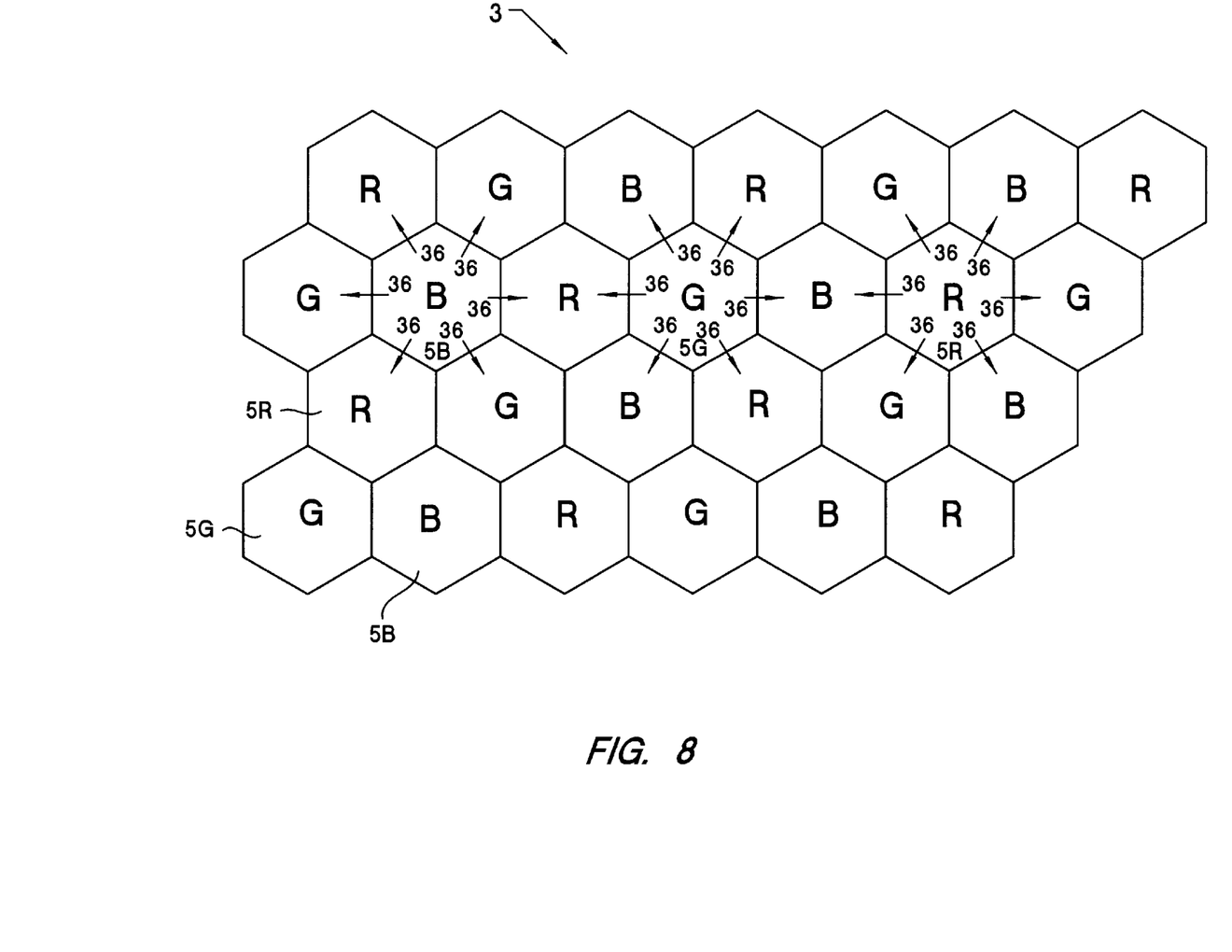
FIG. 8 is a top plan view of an image sensor with an equal distribution RGB color pattern according to the present invention.

In one embodiment of the present invention, as illustrated in FIG. 8, the sensing layer 3 has Red subpixels 5R, Green subpixels 5G, and Blue subpixels 5B in an equal distribution RGB color pattern where the color of the color filter is Red for the Red subpixels 5R, Green for the Green subpixels 5G, and Blue for the Blue subpixels 5B. The sensing layer 3 can have the subpixels oriented such that any given subpixel is surrounded by adjacent subpixels having a different color of the color filter as illustrated by arrows 36. The arrows 36, illustrate the Red subpixel 5R surrounded by Green subpixels and Blue subpixels. The Green subpixel 5G is surrounded by Red subpixels and Blue subpixels. The Blue subpixel 5B is surrounded by Red subpixels and Green subpixels. Although the equal distribution RGB color pattern is illustrated, the present invention is not limited to the equal distribution RGB color pattern and other combinations of colors and color patterns can be used. Although FIG. 8 illustrates the subpixels having a hexagonal shape, the shape of the subpixels can be any non-rectangular shape, for example, the shape of the subpixels can be circular, as noted earlier.

Figure 9:
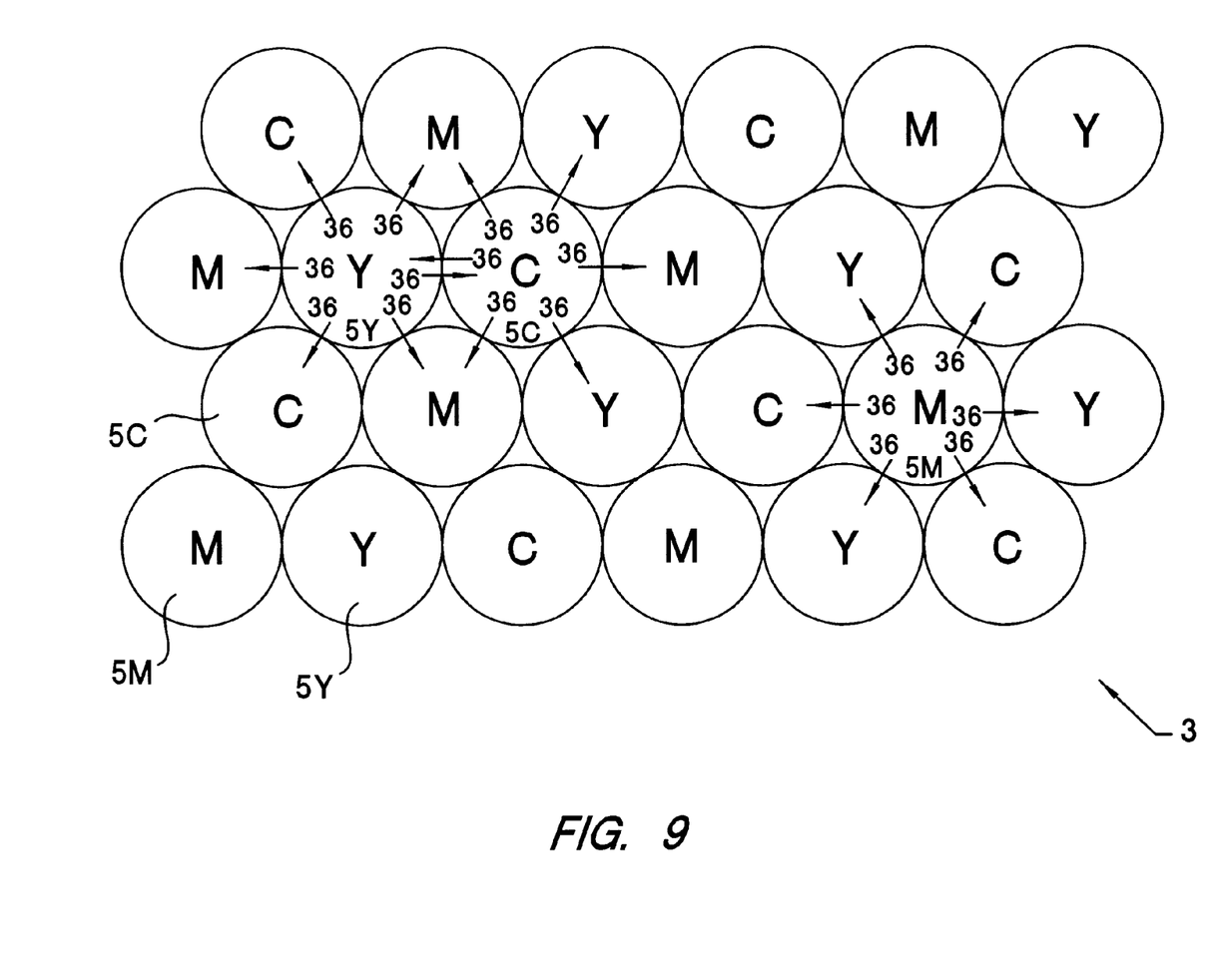
FIG. 9 is a top plan view of a circular array with an equal distribution CMY color pattern according to the present invention.

In one embodiment of the present invention, as illustrated in FIG. 9, the sensing layer 3 has Cyan subpixels 5C, Magenta subpixels 5M, and Yellow subpixels 5Y in an equal distribution CMY color pattern where the color of the color filter is Cyan for the Cyan subpixels 5C, Magenta for the Magenta subpixels 5M, and Yellow for the Yellow subpixels 5Y. As noted above, the sensing layer 3 can have the subpixels oriented such that any given subpixel is surrounded by adjacent subpixels having a different color of the color filter as illustrated by arrows 36.

Figure 10:
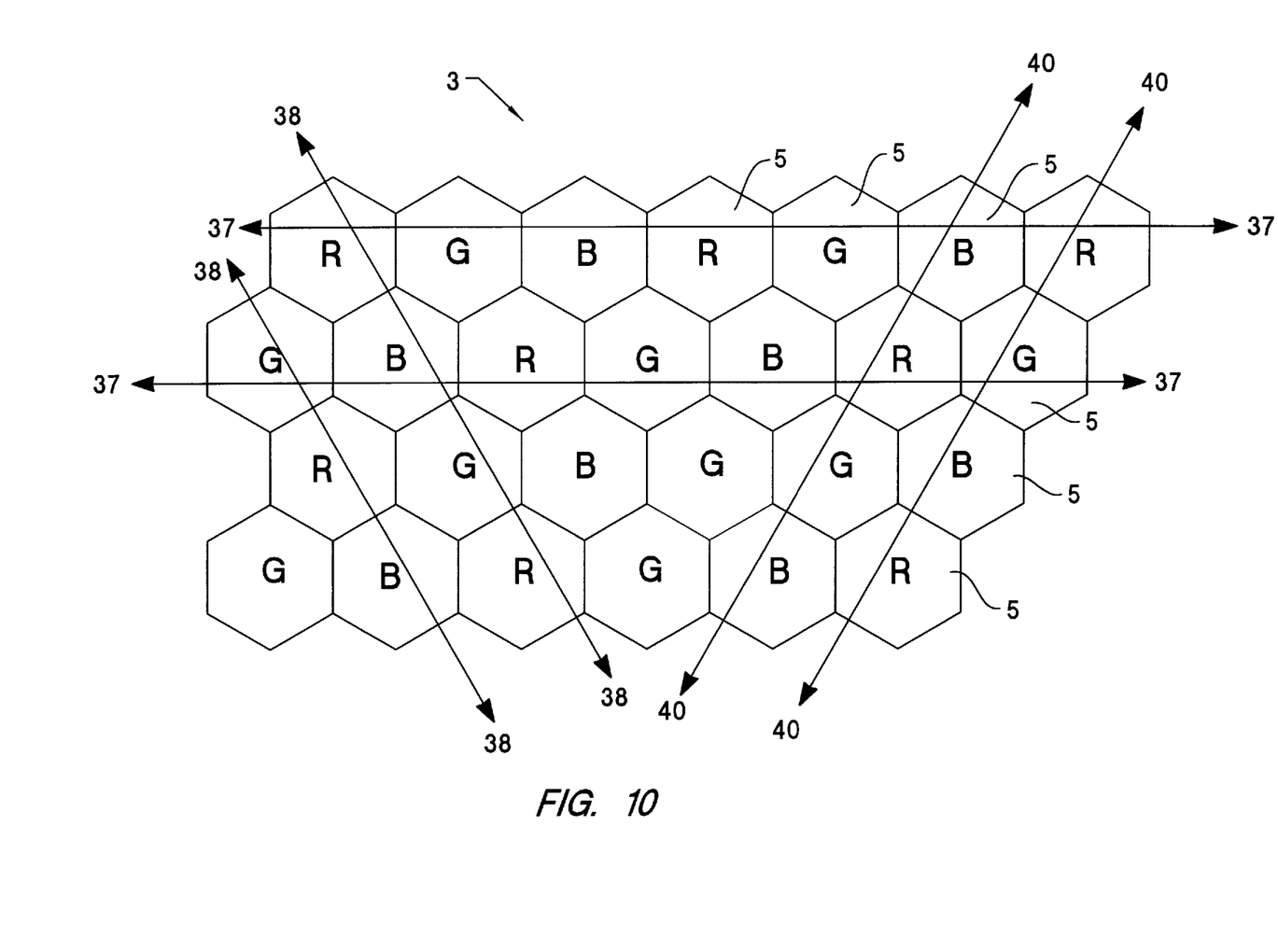
FIG. 10 is a top plan view of an image sensor showing lineal image traversals of the RGB color pattern according to the present invention.

In another embodiment of the present invention, as illustrated in FIG. 10, the sensing layer 3 has each subpixel 5 positioned to establish symmetry between adjacent subpixels 5 so that a lineal image traversal in a horizontal direction, as shown by arrows 37, across horizontally adjacent subpixels 5, results in a complete crossing of the subpixels 5 having the equal distribution RGB color pattern. The arrows 37 show that a lineal image traversal in the horizontal direction results in a sequential crossing of the horizontally adjacent subpixels 5 having a color from the equal distribution RGB color pattern. Although the arrows 37 show a lineal image traversal in the horizontal direction, if sensing layer 3 is rotated 90 degrees, a vertical lineal image traversal would also make a sequential crossing of vertically adjacent subpixels 5 having the equal distribution RGB color pattern.

A lineal image traversal in a first diagonal direction, as shown by arrows 38, across diagonally adjacent subpixels 5 in the sensing layer 3, results in a complete crossing of the diagonally adjacent subpixels 5 having the equal distribution RGB color pattern. Similarly, a lineal image traversal in a second diagonal direction, as shown by arrows 40, of diagonally adjacent subpixels 5, results in a complete crossing of the diagonally adjacent subpixels 5 having the equal distribution RGB color pattern. Although FIG. 10 illustrates the subpixels 5 having a hexagonal shape, the shape of the subpixels 5 can be any non-rectangular shape, for example, the shape of the subpixels 5 can be circular. Further, the color pattern for the sensing layer 3 is not limited to the equal distribution RGB color pattern.

Figure 11:
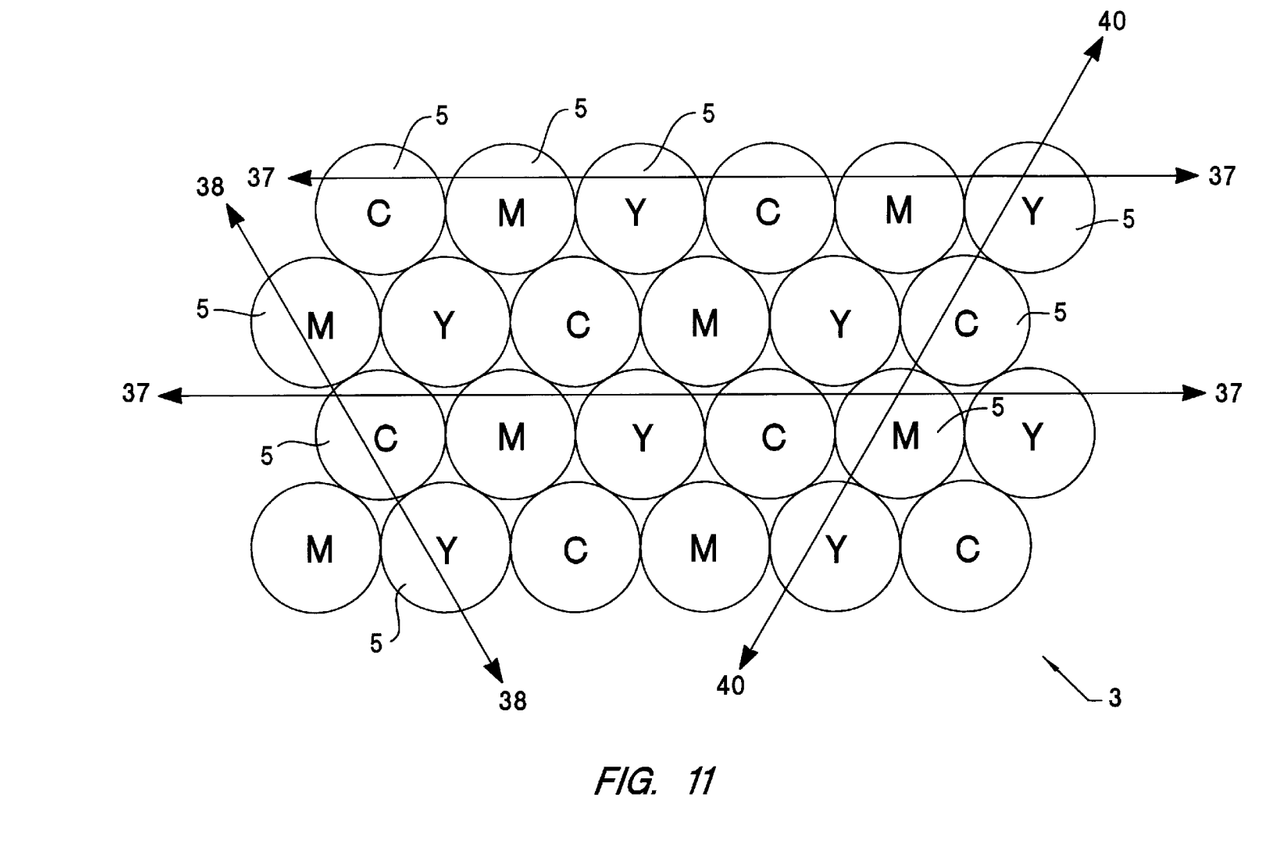
FIG. 11 is a top plan view of an image sensor showing lineal image traversals of the CMY color pattern according to the present invention.

FIG. 11 illustrates the use of an equal distribution CMY color pattern for the sensing layer 3. As noted above, the lineal image traversal in the horizontal direction as shown by arrows 37, the lineal image traversal in the first diagonal direction, as shown by arrow 38, and the lineal image traversal in the second diagonal direction, as shown by arrow 40, result in a sequential crossing of adjacent subpixels 5 in their respective lineal directions.

Figure 12:
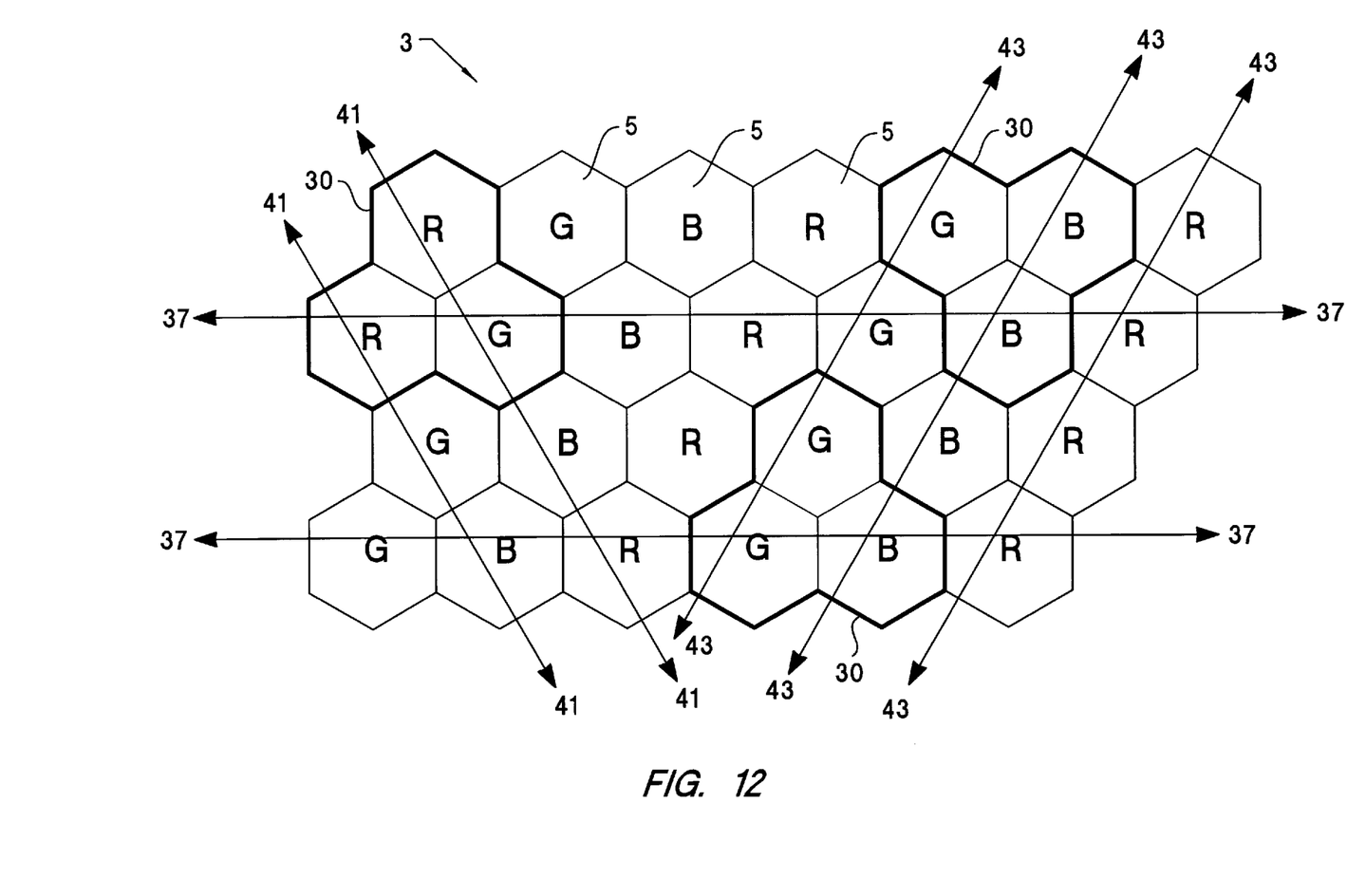
FIG. 12 is a top plan view of an image sensor showing lineal image traversals of a color pattern according to the present invention.

In another embodiment of the present invention, as illustrated in FIG. 12, a pixel 30, shown in heavy outline, includes three of the subpixels 5. The color of the color filter is the same for at least two of the three subpixels 5 in the pixel 30. The sensing layer 3 has pixels 30 positioned so that a lineal image traversal in the horizontal direction results in a sequential crossing of horizontally adjacent subpixels 5 having the RGB color pattern, as shown by arrows 37. Similarly, a lineal image traversal in the vertical direction results in a sequential crossing of vertically adjacent subpixels 5 having the RGB color pattern if the sensing layer 3 is rotated by 90 degrees.

A diagonal lineal image traversal in a first direction, as shown by arrows 43, does not result in a sequential crossing of diagonally adjacent subpixels 5 having the RGB color pattern. Rather, the arrows 43 show that the traversal in the first direction crosses only the diagonally adjacent subpixels 5 having the same color of the color filter. This configuration of the pixels 30 and their respective subpixels 5 can be useful in applications such as video, for example, where the output signals from the diagonally adjacent Red subpixels, the diagonally adjacent Green subpixels, and the diagonally adjacent Blue subpixels can be processed as a group to derive RGB data from an image. Each arrow 43 is parallel to an adjacent arrow 43 such that the group includes Red, Green, and Blue subpixels in a parallel orientation that form an RGB color pattern.

On the other hand, a diagonal lineal image traversal in a second direction, as shown by arrows 41, results in a sequential crossing of diagonally adjacent subpixels 5 having the RGB color pattern. Although the RGB color patten is illustrated, any color pattern may be used, such as the CMY color pattern, for example. Optionally, all of the subpixels 5 in the pixels 30 can have the same color of the color filter. The pixels 30 can be positioned in the sensing layer 3 to implement a variety of application specific color patterns. Although FIG. 12 illustrates the subpixel 5 having a hexagonal shape, the shape of the subpixel 5 can be any non-rectangular shape, for example, the shape of the subpixel 5 can be circular.

Although several embodiments of the present invention have been disclosed and illustrated, the invention is not limited to the specific forms or arrangements of parts so described and illustrated. The invention is only limited by the claims.

What is claimed is:

1. An image sensor, comprising:
    a semiconductor substrate defining a readout layer, the readout layer having a plurality of readout cells formed therein, each of the readout cells having a signal input, the readout cells disposed in rows, each row having readout cells offset in position with respect to the readout cells in an adjacent row;
    a dielectric material formed on the readout layer defining a sensing layer, the sensing layer having a plurality of cavities formed therein, a portion of each of the cavities having an opening in communication with the signal input of one of the readout cells, the cavities arranged in a hexagonal grid layout and positioned in opposing relation to the readout cells;
    an intrinsic amorphous silicon P-I-N photodiode formed in each cavity and operative to generate an output signal indicative of light incident on that P-I-N photodiode;
    an interconnect disposed in the opening of each cavity, the interconnect operative to electrically communicate the output signal from the P-I-N photodiode to the signal input of the readout cell; and
    a biased optically transparent electrode disposed on the P-I-N photodiode, the electrode operative to bias the P-I-N photodiode and to allow light incident on the electrode to be imaged onto the P-I-N photodiode,
    the P-I-N photodiode and the transparent electrode together defining a subpixel.

2. The sensor of claim 1, wherein the shape of the subpixels is substantially hexagonal.

3. The sensor of claim 2, wherein the shape of the subpixels is an equilateral hexagon.

4. The sensor of claim 1, wherein the shape of the subpixels is substantially circular.

5. The sensor of claim 1, wherein each subpixel includes an opaque optical shield layer operative to prevent the light incident on the P-I-N photodiode from impinging on the readout layer.

6. The sensor of claim 1, wherein three subpixels are arranged in a triangular configuration to define a pixel.

7. The sensor of claim 6, wherein three readout cells correspond to the three subpixels in the pixel and the three readout cells are arranged in the triangular configuration.

8. The sensor of claim 1, further comprising an amplifier disposed in each readout cell in electrical communication with the signal input and having an amp output at which an amplified version of the output signal is provided.

9. The sensor of claim 8, wherein the amplifier further comprises:
    a select input operative to enable the amp output whereby the amplified output signal communicates with the amp output when the select input is enabled;
    a terminal in communication with a reset voltage; and
    a reset input operative to set the amp output to the reset voltage.

10. The sensor of claim 9, wherein the readout layer further comprises:
    a serpentine bus formed on the readout layer, the serpentine bus intersecting the rows of the readout layer; and
    a stair-step bus formed on the readout layer, the stair-step bus intersecting the rows of the readout layer,
    the serpentine bus and the stair-step bus operative to communicate signals between the readout cells and the readout layer.

11. The sensor of claim 10, wherein the rows of the readout layer further comprise:
    an A-type interconnect pattern formed on the readout cells of a first row; and
    a B-type interconnect pattern formed on the readout cells of a second row adjacent to the first row,
    the A-type interconnect pattern having a C-shaped interconnect and a first L-shaped interconnect, the B-type interconnect pattern having a second L-shaped interconnect and a third L-shaped interconnect,
    the C-shaped interconnect in electrical communication with the second L-shaped interconnect defining the serpentine bus, and the first L-shaped interconnect in electrical communication with the third L-shaped interconnect defining the stair-step bus.

12. The sensor of claim 11, wherein the serpentine bus is in electrical communication with the amp output and the stair-step bus is in electrical communication with the reset voltage.

13. The sensor of claim 1, wherein the sensing layer further comprises an infrared filter positioned adjacent to the electrode, the infrared filter operative to attenuate the absorption of infrared noise from the light incident on the subpixel.

14. The sensor of claim 1, wherein the sensing layer further comprises a microlens disposed adjacent to the subpixel, the microlens operative to focus incident light onto the subpixel.

15. The sensor of claim 1, wherein the sensing layer further comprises a filter layer positioned adjacent to the electrode, the filter layer operative to pass a selected wavelength of light from the light incident on the subpixel.

16. The sensor of claim 15, wherein the filter layer is a color filter having a predetermined color.

17. The sensor of claim 16, wherein three subpixels define a pixel and the color of the color filter is the same for at least two of the subpixels in the pixel.

18. The sensor of claim 16, wherein the wavelength of the color filter for any given subpixel is different from the wavelength of the color filter of any adjacent subpixel.

19. The sensor of claim 16, wherein the color of the color filter is selected from the group consisting of red, green, blue, cyan, magenta, and yellow.

20. The sensor of claim 16, wherein the colors of the color filters for adjacent subpixels define an equal distribution RGB color pattern and the colors of the color filters are selected from the group consisting of red, green, and blue.

21. The sensor of claim 20, wherein the wavelength of the color filter for any given subpixel is different from the wavelength of the color filter of any adjacent subpixel.

22. The sensor of claim 20, wherein the subpixels are positioned so that a lineal image traversal through adjacent subpixels results in a sequential crossing of the subpixels having the RGB color pattern.

23. The sensor of claim 16, wherein the colors of the color filters for adjacent subpixels define an equal distribution CMY color pattern and the colors of the color filters are selected from the group consisting of cyan, magenta, and yellow.

24. The sensor of claim 23, wherein the wavelength of the color filter for any given subpixel is different from the wavelength of the color filter of any adjacent subpixel.

25. The sensor of claim 23, wherein the subpixels are positioned so that a lineal image traversal through adjacent subpixels results in a sequential crossing of the subpixels having the CMY color pattern.

* * * * *